United States Patent
Byun et al.

(10) Patent No.: US 9,893,136 B2
(45) Date of Patent: Feb. 13, 2018

(54) ORGANIC LIGHT EMITTING DISPLAY DEVICE

(71) Applicant: Samsung Display Co., Ltd., Yongin-si, Gyeonggi-do (KR)

(72) Inventors: Min Woo Byun, Yongin-si (KR); Kyoung Jin Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/055,258

(22) Filed: Feb. 26, 2016

(65) Prior Publication Data

US 2017/0025487 A1   Jan. 26, 2017

(30) Foreign Application Priority Data

Jul. 23, 2015   (KR) .................. 10-2015-0104560

(51) Int. Cl.
*H01L 27/32* (2006.01)
*G09G 3/32* (2016.01)

(52) U.S. Cl.
CPC .......... *H01L 27/3265* (2013.01); *G09G 3/32* (2013.01); *H01L 27/3276* (2013.01)

(58) Field of Classification Search
CPC ............. H01L 27/3248; H01L 27/3262; H01L 27/3265; H01L 27/3276
See application file for complete search history.

(56) References Cited

U.S. PATENT DOCUMENTS 6,771,028 B1 * 8/2004 Winters ............... G09G 3/3233
                                                     315/169.1
2011/0227896 A1 * 9/2011 Hwang ............... H01L 27/3279
                                                     345/211
2013/0193415 A1 * 8/2013 Choi ..................... H01L 51/52
                                                     257/40
2013/0328853 A1 * 12/2013 Hong ................. H01L 27/3265
                                                     345/212
2014/0034923 A1 * 2/2014 Kim ................... H01L 27/3297
                                                     257/40
2015/0014641 A1 * 1/2015 Jung ................... H01L 27/3262
                                                     257/40
2016/0380039 A1 * 12/2016 Oh ..................... H01L 27/3276
                                                     257/40

FOREIGN PATENT DOCUMENTS

KR   10-2008-0013417 A   2/2008

* cited by examiner

*Primary Examiner* — Allan R Wilson
(74) *Attorney, Agent, or Firm* — Lewis Roca Rothgerber Christie LLP

(57) ABSTRACT

An organic light emitting display device includes a substrate on which is included pixel columns extending in a column direction and adjacent to each other in a row direction, data lines extending in the column direction and adjacent to each other and between the pixel columns in the row direction, a power source line extending in the column direction, a scan line extending in the row direction, a switching transistor connected to the scan line and one of the data lines, a driving transistor connected to the switching transistor, an OLED connected to the driving transistor, and a storage capacitor including a first storage capacitor plate and a second storage capacitor plate overlapping the first storage capacitor plate in a thickness direction, connected to the power source line, and having a portion extending in the column direction between and not overlapping the data lines in the thickness direction.

13 Claims, 7 Drawing Sheets

ORGANIC LIGHT EMITTING DISPLAY DEVICE

CROSS-REFERENCE TO RELATED APPLICATION

This application claims priority to and the benefit of Korean Patent Application No. 10-2015-0104560, filed on Jul. 23, 2015 in the Korean Intellectual Property Office, the entire content of which is incorporated herein by reference.

BACKGROUND

1. Field

Aspects of embodiments of the present invention relate to an organic light emitting display device.

2. Description of the Related Art

Recently, various display devices having reduced weight and volume compared to those of cathode ray tube devices have been developed. These display devices include, for example, liquid crystal display devices, field emission display devices, plasma display panels, and organic light emitting display devices.

Organic light emitting display devices include pixels that display images and apply currents to organic light emitting diodes (OLEDs) included in the pixels to display the images. The pixels emit light corresponding to data signals supplied through data lines when scan signals are supplied through scan lines. However, when data lines that supply data signals to different pixels are adjacent to each other (such as side-by-side or without any circuits between them), coupling (such as capacitive coupling) may be generated between the data lines so that the pixels of the organic light emitting display device may not emit light with desired brightness.

SUMMARY

Embodiments of the present invention relate to organic light emitting display devices capable of reducing or preventing coupling (such as capacitive coupling) from being generated between adjacent data lines and reducing or preventing interference of data signals so that pixels emit light with desired brightness.

According to an embodiment of the present invention, an organic light emitting display device is provided. The organic light emitting display device includes a substrate on which is included pixel columns extending in a column direction and adjacent to each other in a row direction, data lines extending in the column direction and adjacent to each other and between the pixel columns in the row direction, a power source line extending in the column direction, a scan line extending in the row direction, a switching transistor connected to the scan line and one of the data lines, a driving transistor connected to the switching transistor, an organic light emitting diode (OLED) connected to the driving transistor, and a storage capacitor including a first storage capacitor plate and a second storage capacitor plate overlapping the first storage capacitor plate in a thickness direction, connected to the power source line, and having a portion extending in the column direction between and not, overlapping the data lines in the thickness direction.

On the substrate in the thickness direction may further include a first gate insulating layer between a semiconductor layer of the driving transistor and the first storage capacitor plate, and a second gate insulating layer between first storage capacitor plate and the second storage capacitor plate.

The first storage capacitor plate may overlap the semiconductor layer of the driving transistor in the thickness direction.

The second storage capacitor plate may be connected to the power source line through a contact hole.

On the substrate in the thickness direction may further include an interlayer insulating layer between the second storage capacitor plate and the data lines.

The data lines may constitute a same layer.

On the substrate in the thickness direction may further include a data insulating layer between the interlayer insulating layer and one of the data lines. Another one of the data lines may be between the interlayer insulating layer and the data insulating layer.

The power source line may further constitute a same layer as the data lines on the interlayer insulating layer.

The second storage capacitor plate may have openings exposing the data lines in the thickness direction.

The scan line may include a protrusion extending in the column direction between and not overlapping the data lines in the thickness direction.

On the substrate may further include an emission control line extending in the row direction and an emission control transistor between the driving transistor and the OLED and connected to the emission control line. The emission control line may include a protrusion extending in the column direction between and not overlapping the data lines in the thickness direction.

The scan line may include a same layer as the second storage capacitor plate.

On the substrate may further include a previous scan line extending in the row direction and an initializing transistor between the driving transistor and an initializing voltage line extending in the row direction and connected to the previous scan line. The previous scan line may include a protrusion extending in the column direction between and not overlapping the data lines in the thickness direction.

In organic light emitting display devices according to embodiments of the present invention, it is possible to reduce or prevent coupling (e.g., capacitive coupling) from being generated between adjacent data lines so that it is possible to reduce or prevent interference of data signals. Therefore, pixels may stably receive the data signals and may emit light with desired brightness.

DETAILED DESCRIPTION

Figure 1:
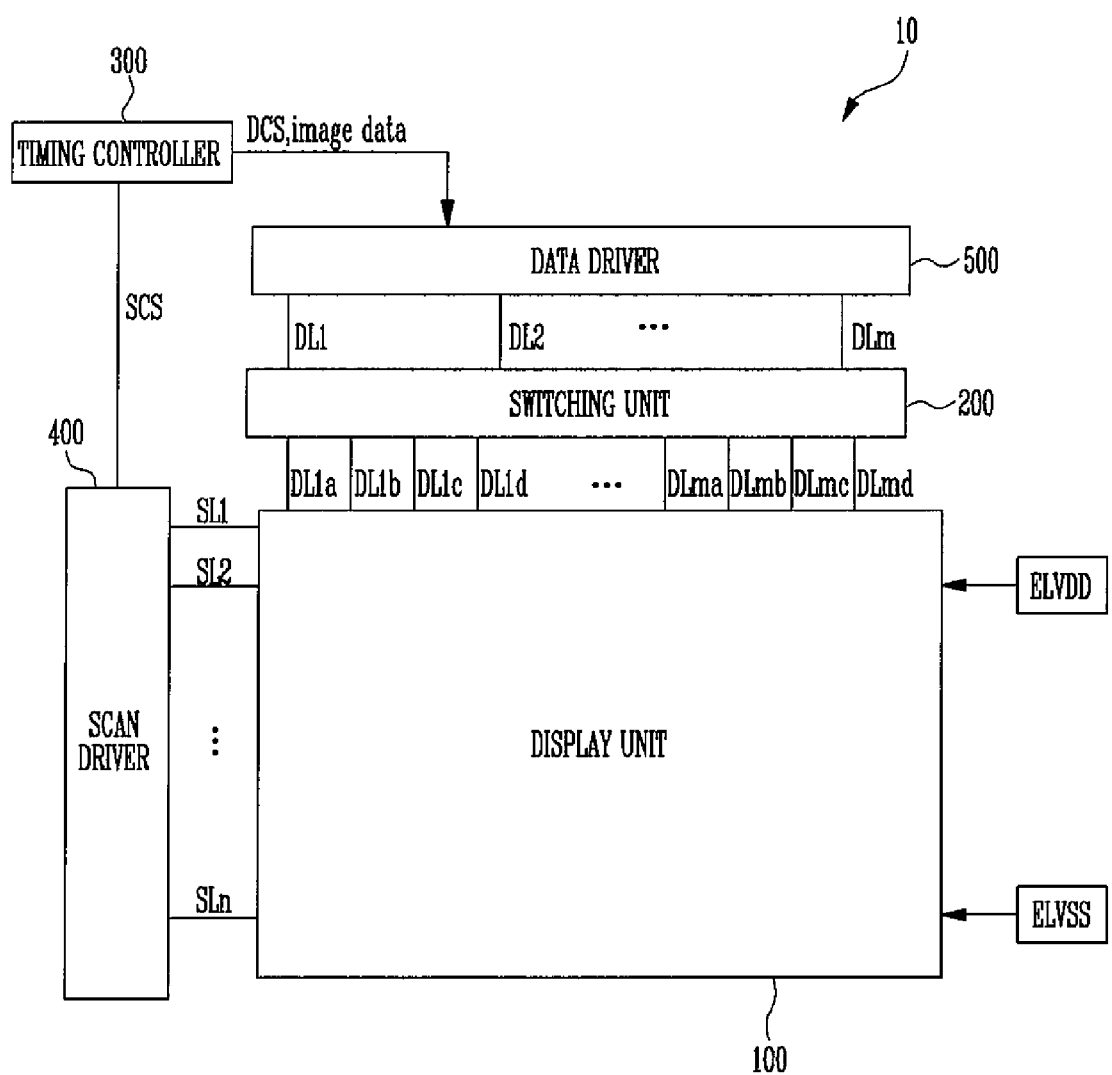
FIG. 1 is a schematic block diagram of an organic light emitting display device according to an embodiment of the present invention.

Embodiments of the present invention will now be described more fully with reference to the accompanying drawings. The present invention may, however, be embodied in many different forms and should not be construed as limited to the embodiments set forth herein. Rather, these embodiments are provided to more fully convey the scope of the present invention to one of ordinary skill in the art.

In the drawing figures, dimensions may be exaggerated for clarity of illustration. It will be understood that when an element is referred to as being "between" two elements, it can be the only element between the two elements, or one or more intervening elements may also be present. Like or similar reference numerals refer to like or similar elements throughout.

It will be understood that, although the terms first and second, etc., may be used herein to describe various elements, these elements should not be limited by these terms. These terms are mainly used to distinguish one element from another element. For example, a first element may be named a second element and similarly a second element may be named a first element without departing from the scope of the present invention.

It will also be understood that when an element is referred to as being "on" another element, it can be directly on the other element, or intervening elements may also be present. On the other hand, when an element is referred to as being "immediately on" or as "directly contacting" another element, it can be understood that intervening elements do not exist. Other expressions describing a relationship between elements, for example, "between" and "directly between" may be interpreted as described above.

Unless otherwise defined, terms such as "include" and "have" are for representing that characteristics, numbers, steps, operations, elements, and parts described in the specification or a combination of the above exist. It may also be interpreted that one or more other characteristics, numbers, steps, operations, elements, parts, and combinations of the above may also exist. Unless otherwise defined, all terms (including technical and scientific terms) used herein have the same meaning as commonly understood by one of ordinary skill in the art to which the present invention belongs.

Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

It will be understood that while the physical elements described herein exist in three dimensions, an element will be said to "extend" in a particular direction when the element (or portion thereof being referred to) takes on its greatest length in that direction, as would be apparent to one of ordinary skill.

Hereinafter, embodiments of the present invention will be described in further detail with reference to the accompanying drawings.

FIG. 1 is a schematic block diagram of an organic light emitting display device 10 according to an embodiment of the present invention.

Referring to FIG. 1, the organic light emitting display device 10 may include a timing controller 300, a scan driver 400, a data driver 500, a switching unit 200, and a display unit 100. The timing controller 300 may generate a data driving control signal DCS and a scan driving control signal SCS in response to synchronizing signals (for example, a vertical synchronizing signal, a horizontal synchronizing signal, a data enable signal, and an image data signal) supplied from the outside.

The timing controller 300 may supply the data driving control signal DCS to the data driver 500 and may supply the scan driving control signal SCS to the scan driver 400. In addition, the timing controller 300 may supply image data supplied from the outside to the data driver 500.

The scan driver 400 may supply (for example, sequentially supply) scan signals to scan lines SL1 to SLn in accordance with the scan driving control signal SCS supplied from the timing controller 300. The data driver 500 may generate data signals by using the image data input from the timing controller 300 and the data driving control signal DCS, and may respectively supply the generated data signals to data lines DL1 to DLm. The data driver 500 may be formed, for example, on a common substrate with the display unit 100, or may be mounted on the substrate on which the display unit 100 is fabricated in the form of an integrated circuit (e.g., may be mounted next to the display unit 100).

The switching unit 200 may include a demultiplexer circuit and may transmit the data signals received from the data driver 500 to the display unit 100 in accordance with a switching control signal. The switching unit 200 receives the data signals from the data driver 500 through the data lines D1 to Dm, selects auxiliary data lines DL1a to DLmd that supply the data signals in accordance with input control signals, and supplies the data signals to the display unit 100 through the selected auxiliary data lines DL1a to DLmd. A method of the switching unit 200 selecting the auxiliary data lines DL1a to DLmd will be described in further detail with reference to FIG. 2. It should be noted that the switching unit 200 is optional, and the number of auxiliary data lines (such as the number of auxiliary data lines per data line) may vary between embodiments of the switching unit 200.

The display unit 100 may include pixels that display a set or predetermined image and may display the image in accordance with control of the timing controller 300. For example, when a scan signal is supplied to a scan line (one of the scan lines SL1 to SLn), each of the pixels of the corresponding pixel row may receive a data signal from a selected data line (one of the data lines DL1 to DLm and, optionally, one of the auxiliary data lines DL1a to DLmd). Each of the pixels may emit light with brightness corresponding to the data signal.

A power source supplying unit is disposed outside the display unit 100 and may generate a driving power source to be supplied to the timing controller 300 or each of the pixels of the display unit 100. For example, a power source supplying unit may receive a set or predetermined voltage from a power source such as a battery, may convert the received voltage into a first power source voltage ELVDD and a second power source voltage ELVSS that are used by the pixels, and may supply the first power source voltage ELVDD and the second power source voltage ELVSS to the pixels.

Figure 2:
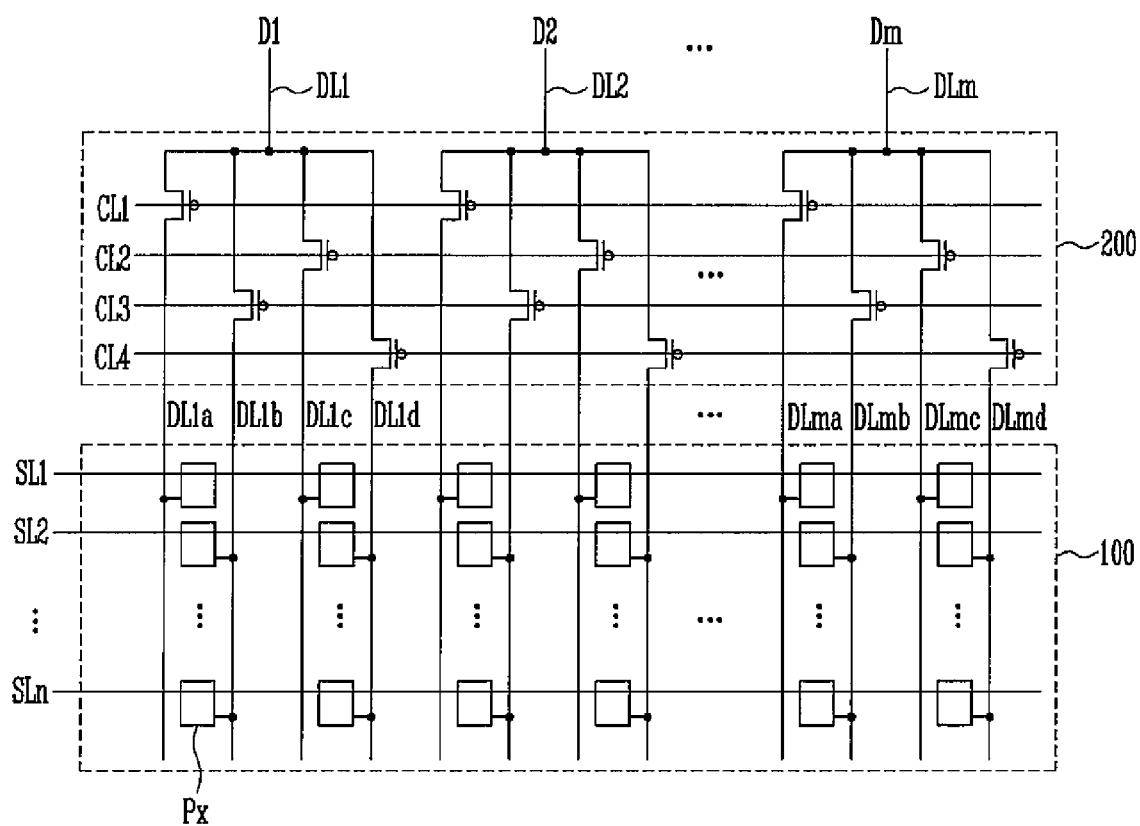
FIG. 2 is a conceptual view of a switching unit and a display unit of FIG. 1 according to an embodiment of the present invention.

FIG. 2 is a conceptual view of the switching unit 200 and the display unit 100 of FIG. 1 according to an embodiment of the present invention.

Referring to FIG. 2, the switching unit 200 selects one of the auxiliary data lines DL1a to DLmd (e.g., one auxiliary data line for each of the data lines DL1 to DLm) in accordance with control signals CL1 to CL4 and may supply the data signals D1 to Dm from the respective data lines DL1 to DLm to the pixels through the selected ones of the auxiliary data lines DL1a to DLmd. For example, in the embodiment of FIG. 2, there are four auxiliary data lines DLia, DLib, DLic, and DLid for each data line DLi, each of the four auxiliary data lines DLia to DLid being selected by a corresponding one of the four control signals CL1 to CL4.

The switching unit 200 may include a plurality of transistors turned on in accordance with inputs of the control signals CL1 to CL4. When the control signals CL1 to CL4 at on levels are input to gate electrodes of transistors, data signals supplied to first electrodes (e.g., source electrodes) of the transistors may be supplied to auxiliary data lines connected to second electrodes (e.g., drain electrodes) of the transistors.

For example, the first control signal CL1, the second control signal CL2, the third control signal CL3, and the fourth control signal CL4 may sequentially maintain the on levels and the corresponding transistors that receive the control signals CL1 to CL4 at the on levels may be sequentially turned on. E.g., the first control signal CL1 may divert data signals from the data lines DL1, DL2, . . . , DLm to the corresponding first auxiliary data lines DL1a, DL2a, . . . , DLma, the second control signal CL2 may divert data signals from the data lines DL1, DL2, . . . , DLm to the corresponding second auxiliary data lines DL1b, DL2b, . . . , DLmb, etc.

The display unit 100 may include a plurality of pixels Px connected to the auxiliary data lines DL1a to DLmd and the scan lines SL1 to SLn (e.g., in a matrix format, with rows of pixels corresponding to the scan lines SL1 to SLn and columns of data lines each corresponding to one or more (such as two) of the auxiliary data lines DL1a to DLmd). When a scan signal is supplied through a scan line (one of the scan lines SL1 to SLn), each of the pixels Px may emit light with brightness corresponding to a data signal. A pixel according to the embodiment of the present invention will be described in further detail with reference to FIG. 3.

Here, for convenience sake, the pixels Px formed in a direction in which the auxiliary data lines DL1a to DLmd extend are referred to as a pixel column while the pixels Px formed in a direction in which the scan lines SL1 to SLn extend are referred to as a pixel row. Further, it will be assumed that at least two auxiliary data lines DL1a to DLmd are provided for each pixel column (e.g., between any two adjacent pixel columns). Such (at least two) auxiliary data lines between a pair of adjacent pixel columns will be referred to as adjacent auxiliary data lines, where there are no pixels between the adjacent auxiliary data lines (e.g., the adjacent auxiliary data lines are side-by-side or have no other circuits between them).

For example, the adjacent auxiliary data lines may include two adjacent auxiliary data lines between each pair of adjacent pixel columns. One of these two adjacent auxiliary data lines may be referred to as an odd auxiliary data line and the other one may be referred to as an even auxiliary data line. According to some embodiments, pixels Px disposed in odd rows may be connected to odd (e.g., first and third) auxiliary data lines DL1a, DL1c, . . . , and DLmc disposed on one side and pixels Px disposed in even rows may be connected to even (e.g., second and fourth) auxiliary data lines DL1b, DL1d, . . . , and DLmd disposed on the other side that faces the one side.

Figure 3:
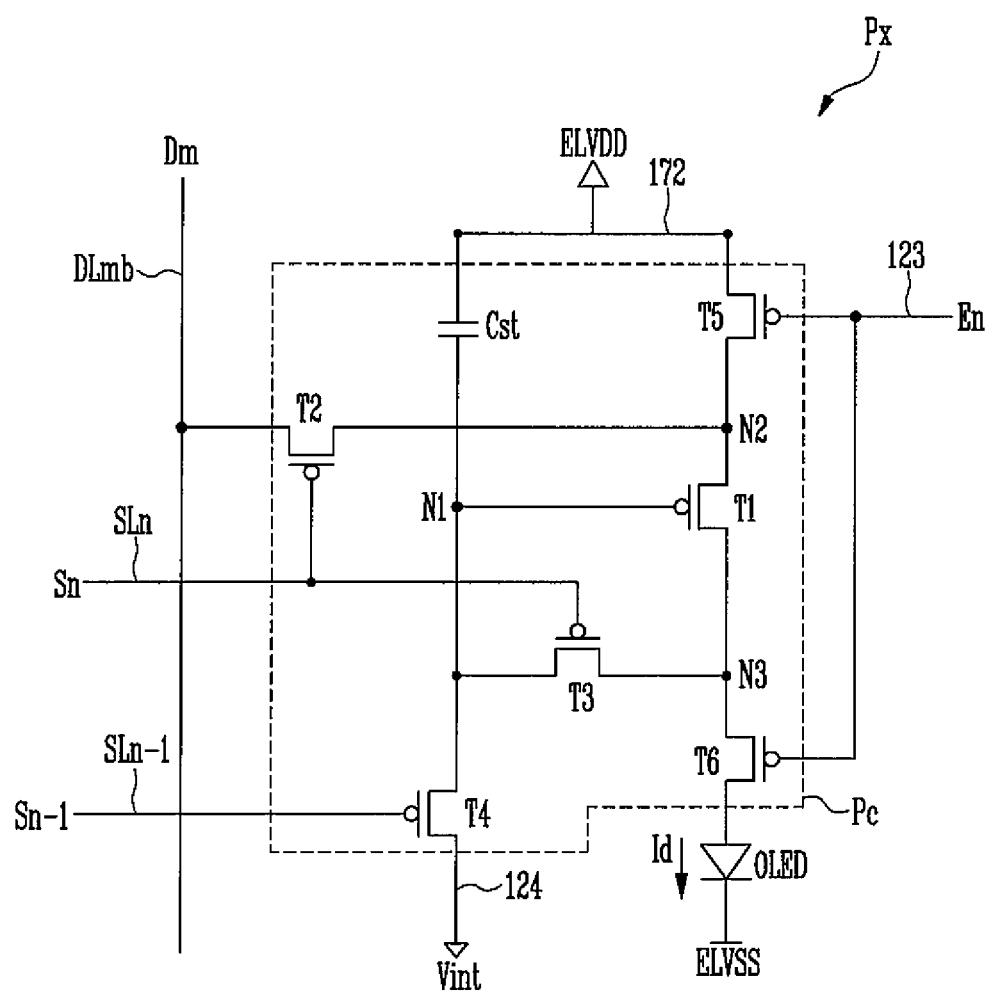
FIG. 3 is a circuit view of a pixel of FIG. 2 according to an embodiment of the present invention.

FIG. 3 is a circuit view of a pixel Px of FIG. 2 according to an embodiment of the present invention.

Referring to FIG. 3, the pixel Px may include an organic light emitting diode (OLED) that emits light and a pixel circuit Pc that supplies a driving current to the OLED. The pixel circuit Pc may include a driving transistor T1, a switching transistor T2, a compensating transistor T3, an initializing transistor T4, an operation control transistor T5, and an emission control transistor T6. In addition, the pixel circuit Pc may include a storage capacitor Cst and an OLED. Elements included in the pixel circuit Pc may be connected to a plurality of signal lines.

The scan line SLn is connected to gate electrodes of the switching transistor T2 and the compensating transistor T3 and supplies a scan signal Sn. The previous scan line SLn−1 is connected to a gate electrode of the initializing transistor T4 and supplies a previous scan signal Sn−1. An emission control line 123 is connected to gate electrodes of the operation control transistor T5 and the emission control transistor T6 and supplies an emission control signal En.

The second auxiliary data line DLmb (an even auxiliary data line) is connected to a first electrode of the switching transistor T2 and supplies the data signal Dm. In other rows (e.g., the odd rows), the first auxiliary data line DLma (an odd auxiliary data line) may instead be connected to the first electrode of the switching transistor T2 to supply the data signal Dm.

A first power source voltage line (power source line) 172 is connected to a first electrode of the operation control transistor T5 and a second terminal (plate) of the storage capacitor Cst and supplies the first power source voltage ELVDD. An initializing voltage line 124 is connected to a second electrode of the initializing transistor T4 to supply an initializing voltage Vint that initializes the driving transistor T1.

Hereinafter, a connection relationship between the plurality of transistors T1 to T6 and the storage capacitor Cst will be described in, further detail. The gate electrode of the driving transistor T1 is connected to a first terminal (plate) of the storage capacitor Cst, the first electrode thereof is connected to a second node N2, and the second electrode thereof is connected to a third node N3. The driving transistor T1 receives the data signal Dm in accordance with a switching operation of the switching transistor T2 and may supply a driving current Id to the OLED.

The gate electrode of the switching transistor T2 is connected to the scan line SLn, the first electrode thereof is connected to the second auxiliary data line DLmb, and the second electrode thereof is connected to the second node N2. The switching transistor T2 is turned on in accordance with the scan signal Sn received through the scan line SLn and may perform the switching operation of supplying the data signal Dm transmitted to the second auxiliary data line DLmb to the first electrode of the driving transistor T1.

The gate electrode of the compensating transistor T3 is connected to the scan line SLn, the first electrode thereof is connected to the first node N1, and the second electrode thereof is connected to the third node N3. The compensating transistor T3 is turned on in accordance with the scan signal Sn received through the scan line SLn and may connect the gate electrode and the second electrode of the driving transistor T1 so that the driving transistor T1 may be diode-connected.

The gate electrode of the initializing transistor T4 is connected to the previous scan line SLn−1, the first electrode thereof is connected to the first node N1, and the second electrode thereof is connected to the initializing voltage line 124. The initializing transistor T4 is turned on in accordance with the previous scan signal Sn−1 received through the previous scan line SLn−1 and may transmit the initializing voltage Vint to the gate electrode of the driving transistor T1 so that the initializing transistor T4 may perform an initializing operation of initializing a voltage of the gate electrode of the driving transistor T1.

The gate electrode of the operation control transistor T5 is connected to the emission control line 123, the first electrode thereof is connected to the first power source voltage line 172, and the second electrode thereof is connected to the second node N2. The gate electrode of the emission control transistor T6 is connected to the emission control line 123, the first electrode thereof is connected to the third node N3, and the second electrode thereof is electrically connected to an anode of the OLED. The operation control transistor T5 and the emission control transistor T6 are concurrently (e.g., simultaneously) turned on in accordance with the emission control signal En transmitted through the emission control line 123 and supply the first power source voltage ELVDD to the OLED so that the driving current Id flows to the OLED.

The second terminal (plate) of the storage capacitor Cst is connected to the first power source voltage line 172 and the first terminal (plate) thereof is connected to the first node N1. The anode of the OLED is connected to the second electrode of the emission control transistor T6 and a cathode thereof is connected to the second power source voltage ELVSS. The OLED receives the driving current Id from the driving transistor T1 and emits light so that an image may be displayed.

Figure 4:
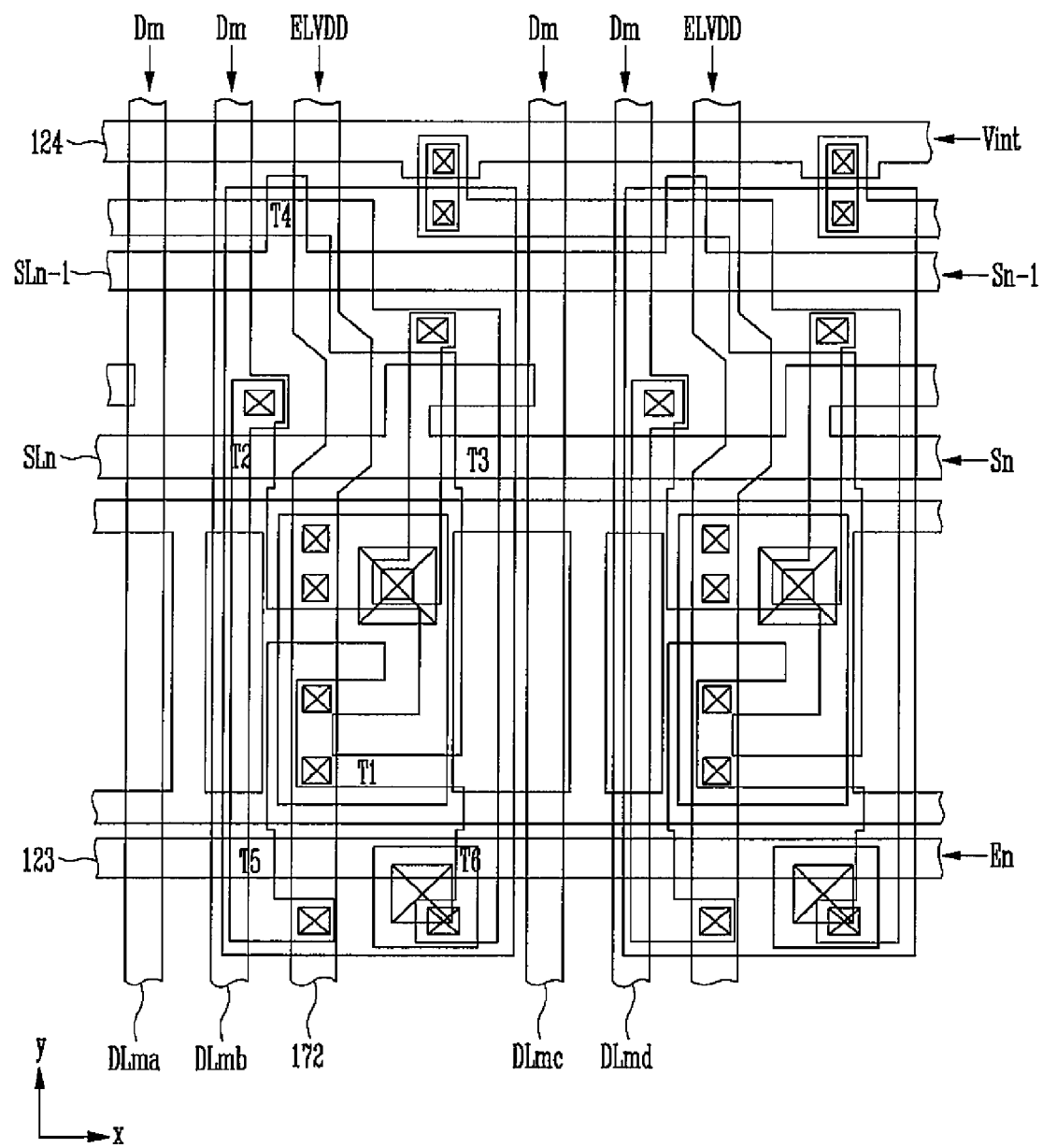
FIG. 4 is a schematic layout diagram of a portion of the display unit of FIG. 2 according to an embodiment of the present invention.
Figure 5:
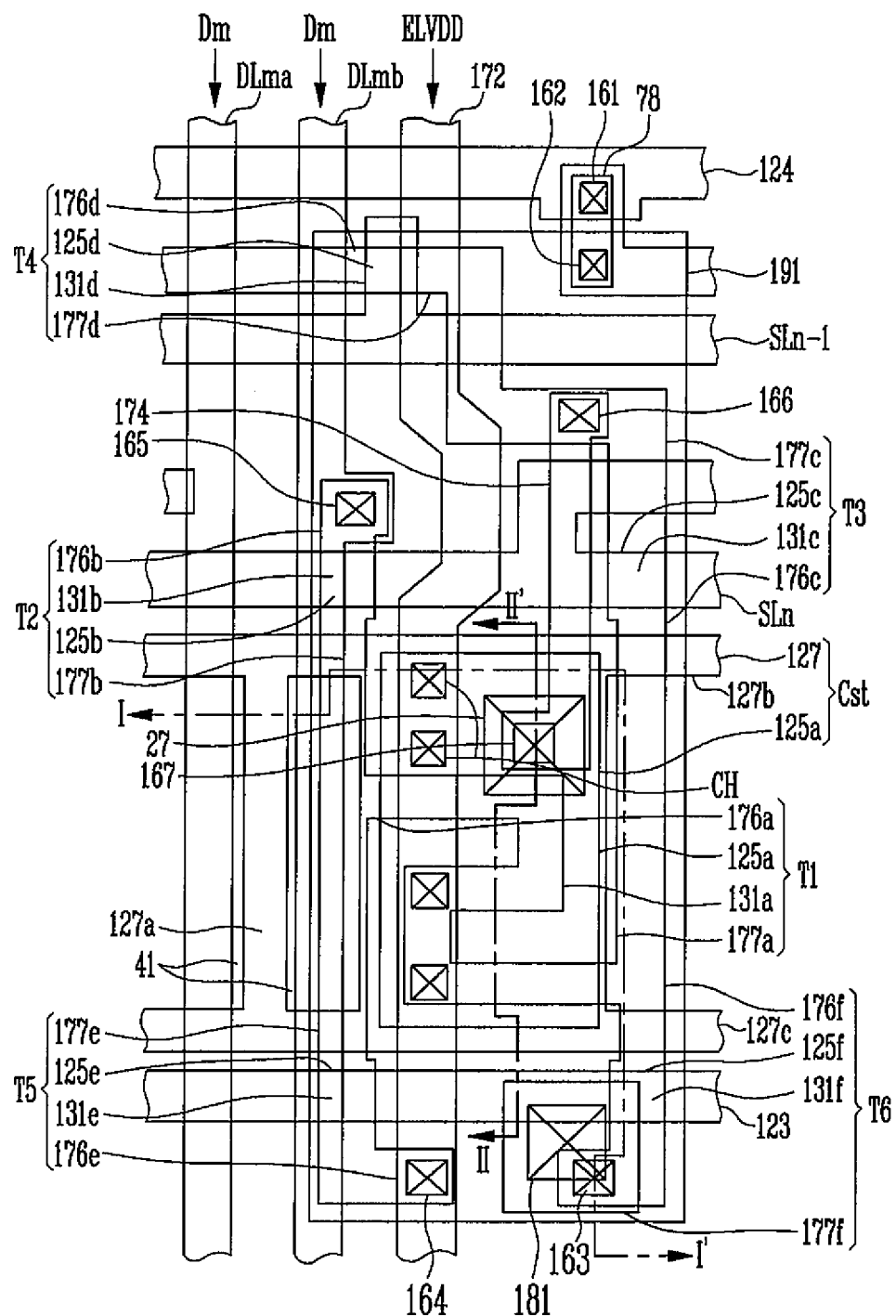
FIG. 5 is a schematic layout diagram of a pixel of FIG. 4 according to an embodiment of the present invention.

FIG. 4 is a schematic layout diagram of a portion of the display unit 100 of FIG. 2 according to an embodiment of the present invention. FIG. 5 is a schematic layout diagram of a pixel of FIG. 4 according to an embodiment of the present invention. The portion of the display unit of FIG. 4 includes two pixels extending in a row direction. For ease of description, these pixels are assumed to be even row pixels, and are connected to even auxiliary data lines. Other pixels (e.g., odd row pixels) may be connected to odd auxiliary data lines as would be apparent to one of ordinary skill.

Referring to FIGS. 4 and 5, the pixel Px of the organic light emitting display device may be connected to the second auxiliary data line DLmb (or the fourth auxiliary data line DLmd) and the first power source voltage line 172 that are disposed in a first direction (a y axis direction, along with the first and third auxiliary data lines DLma and DLmc) and may respectively receive the data signal Dm and the first power source voltage ELVDD.

In addition, the pixel Px may be connected to the scan line SLn, the previous scan line SLn−1, the emission control line 123, and the initializing voltage line 124 that cross the first auxiliary data line DLma in a second direction (an x-axis direction, along with the second storage capacitor plate 127, which is connected in common across the pixels of the same row) and may respectively receive the scan signal Sn, the previous scan signal Sn−1, the emission control signal En, and the initializing voltage Vint. For convenience sake, an x axis direction and a row direction are the same and the y axis direction and a column direction are the same.

In addition, the driving transistor T1, the switching transistor T2, the compensating transistor T3, the initializing transistor T4, the operation control transistor T5, the emission control transistor T6, the storage capacitor Cst, and the OLED may be disposed in the pixel Px. The driving transistor T1, the switching transistor T2, the compensating transistor T3, the initializing transistor T4, the operation control transistor T5, and the emission control transistor T6 may be disposed along driving, switching, compensating, initializing, operation control, and emission control semiconductor layers 131a to 131f, respectively (e.g., formed from a common semiconductor layer and etched into separate portions constituting the driving, switching, compensating, initializing, operation control, and emission control semiconductor layers 131a to 131f).

Each of the driving, switching, compensating, initializing, operation control, and emission control semiconductor layers 131a to 131f may be formed of polysilicon and include a channel region that is not doped with impurities and a source region and a drain region formed by doping impurities on both sides of the channel region. Here, the impurities may vary in accordance with a kind of the transistors and n-type impurities or p-type impurities may be doped on the channel region.

The driving, switching, compensating, initializing, operation control, and emission control semiconductor layers 131a to 131f may include the driving semiconductor layer 131a disposed in the driving transistor T1, the switching semiconductor layer 131b formed in the switching transistor T2, the compensating semiconductor layer 131c formed in the compensating transistor T3, the initializing semiconductor layer 131d formed in the initializing transistor T4, the operation control semiconductor layer 131e formed in the operation control transistor T5, and the emission control semiconductor layer 131f formed in the emission control transistor T6.

The driving transistor T1 may include the driving semiconductor layer 131a, a driving gate electrode 125a, a driving source electrode 176a, and a driving drain electrode 177a. Because the driving transistor T1 has a source electrode whose signal is generated internally to the pixel circuit Pc (and not supplied directly from a signal line external the pixel circuit Pc), a driving source region doped with impurities in the driving semiconductor layer 131a may serve as and be referred to as the driving source electrode 176a. The same explanation may also apply to other electrodes of this and other transistors of the pixel circuit Pc. For example, a driving drain region doped with impurities in the driving semiconductor layer 131a may serve as and be referred to as the driving drain electrode 177a.

The storage capacitor Cst may be formed from a second storage capacitor plate 127 on the driving gate electrode 125a (serving as a first storage capacitor plate 125a) to overlap the driving gate electrode 125a in a plan view (e.g., a thickness direction). In the storage capacitor Cst, a first surface (terminal or plate) may be implemented by the driving gate electrode 125a and a second surface (terminal or plate) may be implemented by the second storage capacitor plate 127. For convenience sake, the driving gate electrode 125a may be referred to as the first storage capacitor plate 125a.

Here, capacitance of the storage capacitor Cst is determined by factors such as a voltage difference and a distance between the first storage capacitor plate 125a and the second storage capacitor plate 127, and a corresponding charge may be accumulated by the storage capacitor Cst. The storage capacitor Cst may be formed by overlapping (e.g., in the thickness direction) a part of the second storage capacitor plate 127 and the first storage capacitor plate 125a.

The second storage capacitor plate 127 of the storage capacitor Cst may be formed in the same layer as the scan line SLn, the previous scan line SLn−1, the emission control line 123, a switching gate electrode 125b, a compensating gate electrode 125c, an initializing gate electrode 125d, an operation control gate electrode 125e, and an emission control gate electrode 125f. In addition, the second storage capacitor plate 127 of the storage capacitor Cst may be formed of the same material as the scan line SLn, the previous scan line SLn−1, the emission control line 123, the switching gate electrode 125b, the compensating gate electrode 125c, the initializing gate electrode 125d, the operation control gate electrode 125e, and the emission control gate electrode 125f.

The second storage capacitor plate 127 may be connected to the first power source voltage line 172 through one or more contact holes CH disposed in an interlayer insulating layer 160 (see FIG. 6) and may receive a constant voltage (such as the first power source voltage ELVDD) from the first power source voltage line 172. In addition, the second storage capacitor plates 127 of the pixels Px of the same row may be connected together by extension lines (e.g., first extension line 127b and second extension line 127c extending from opposite ends of the second storage capacitor plate 127 in the row direction) in the same layer as, and formed from the same material as, the second storage capacitor plate 127.

The second storage capacitor plate 127 may further include an extension unit 127a that extends between, is in the same layer and formed from the same material as, and connects the first extension line 127b and the second extension line 127c in the column direction, and lies between (e.g., in the thickness direction and without overlapping) and in a different layer than the first auxiliary data line DLma and the second auxiliary data line DLmb in the row direction. Since a constant voltage (e.g., the first power source voltage ELVDD) is applied to the extension unit 127a of the second storage capacitor plate 127, it is possible to reduce or prevent coupling (such as capacitive coupling) from being generated between the first auxiliary data line DLma and the second auxiliary data line DLmb that are adjacent to each other.

For example, when the data signal Dm is supplied to the first auxiliary data line DLma, the second storage capacitor plate 127 (via the extension unit 127a) may block interference generated by the second auxiliary data line DLmb. The second storage capacitor plate 127 may be formed in the same layer as the initializing voltage line 124. In addition, the second storage capacitor plate 127 may be formed of the same material as the initializing voltage line 124.

The switching transistor T2 may include the switching semiconductor layer 131b, the switching gate electrode 125b, the switching source electrode 176b, and a switching drain electrode 177b. The switching source electrode 176b may protrude from the second auxiliary data line DLmb, and be connected to a switching source region doped with impurities in the switching semiconductor layer 131b via a contact hole 165. For pixels in other rows (e.g., odd rows), the switching source electrode 176b may instead protrude from the first auxiliary data line DLma as would be apparent to one of ordinary skill. The switching drain electrode 177b may be a switching drain region doped with impurities in the switching semiconductor layer 131b.

The compensating transistor T3 may include the compensating semiconductor layer 131c, the compensating gate electrode 125c, a compensating source electrode 176c, and a compensating drain electrode 177c. The compensating source electrode 176c may be a compensating source region doped with impurities in the compensating semiconductor layer 131c. The compensating drain electrode 177c may be a compensating drain region doped with impurities in the compensating semiconductor layer 131c.

The initializing transistor T4 may include the initializing semiconductor layer 131d, an initializing gate electrode 125d, an initializing source electrode 176d, and an initializing drain electrode 177d. The initializing drain electrode 177d may be an initializing drain region doped with impurities in the initializing semiconductor layer 131d.

The initializing source electrode 176d may be an initializing source region doped with impurities in the initializing semiconductor layer 131d, and may be connected to the initializing voltage line 124 through an initializing connection line 78. For example, one end of the initializing connection line 78 may be connected to the initializing voltage line 124 through a contact hole 161, and the other end of the initializing connection line 78 may be connected to the initializing source electrode 176d through a contact hole 162.

The operation control transistor T5 may include the operation control semiconductor layer 131e, the operation control gate electrode 125e, an operation control source electrode 176e, and an operation control drain electrode 177e. The operation control source electrode 176e is a part of the first power source voltage line 172, and may be connected to an operation control source region doped with impurities in the operation control semiconductor layer 131e via a contact hole 164. The operation control drain electrode 177e may be an operation control drain region doped with impurities in the operation control semiconductor layer 131e.

The emission control transistor T6 may include the emission control semiconductor layer 131f, the emission control gate electrode 125f, an emission control source electrode 176f, and an emission control drain electrode 177f. The emission control source electrode 176f may be an emission control source region doped with impurities in the emission control semiconductor layer 131f. The emission control drain electrode 177f may be connected to an emission control drain region doped with impurities in the emission control semiconductor layer 131f via a contact hole 163, and to the pixel electrode 191 (of an OLED) via a contact hole 181.

One end of the driving semiconductor layer 131a (e.g., a source end) of the driving transistor T1 may be connected to the switching semiconductor layer 131b (e.g., at a drain end) and the operation control semiconductor layer 131e (e.g., at a drain end), and the other end of the driving semiconductor layer 131a (e.g., a drain end) of the driving transistor T1 may be connected to the compensating semiconductor layer 131c (e.g., at a source end) and the emission control semiconductor layer 131f (e.g., at a source end). Therefore, the driving source electrode 176a may be connected to the switching drain electrode 177b and the operation control drain electrode 177e, and the driving drain electrode 177a may be connected to the compensating source electrode 176c and the emission control source electrode 176f.

The first storage capacitor plate 125a of the storage capacitor Cst may be connected to the compensating drain electrode 177c and the initializing drain electrode 177d through a connection member 174. The connection member 174 may be formed in the same layer as the first to fourth auxiliary data lines DLma to DLmd. One end of the connection member 174 may be connected to the compensating drain electrode 177c and the initializing drain electrode 177d through a contact hole 166, and the other end of the connection member 174 may be connected to the first storage capacitor plate 125a through a contact hole 167. In further detail, the other end of the connection member 174 may be connected to the first storage capacitor plate 125a via the contact hole 167 through a storage opening 27 disposed in the second storage capacitor plate 127.

In addition, the second storage capacitor plate 127 may include openings 41 exposing the first auxiliary data line DLma and the second auxiliary data line DLmb (and defining the extension unit 127a) in a plan view (e.g., a thickness direction). Since the openings 41 are disposed on the first auxiliary data line DLma and the second auxiliary data line DLmb, coupling generated between the second storage capacitor plate 127 and the first and second auxiliary data lines DLma and DLmb may be reduced or minimized.

The switching transistor T2 may be used as a switching element that selects a pixel from which it is desired to emit light. The switching gate electrode 125b is connected to the scan line SLn, the switching source electrode 176b is connected to the second auxiliary data line DLmb, and the switching drain electrode 177b may be connected to the driving transistor T1 and the operation control transistor T5.

Figure 6:
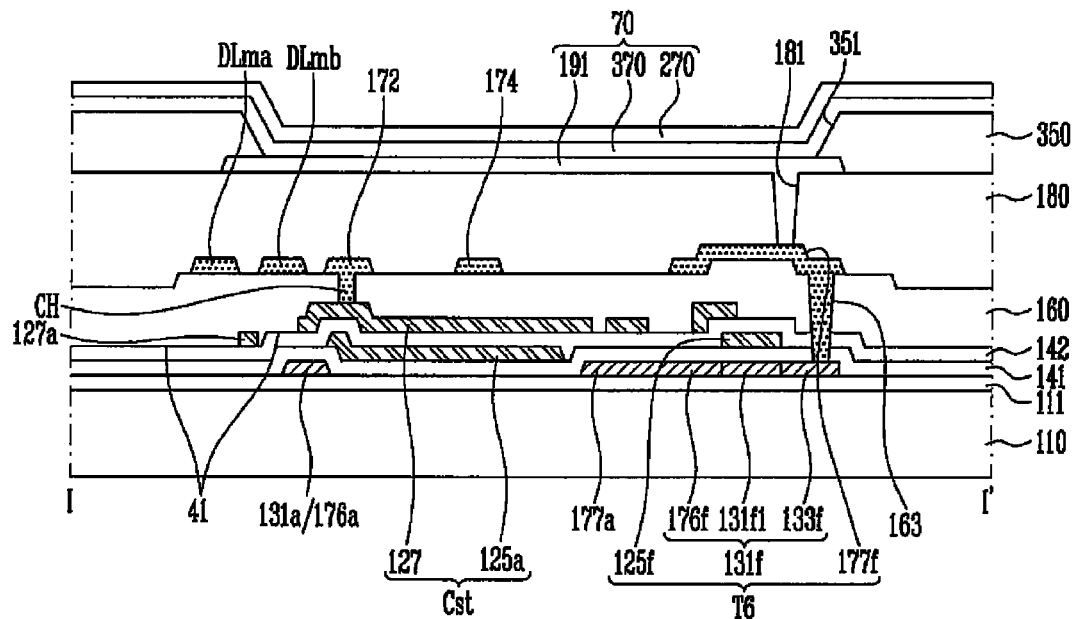
FIG. 6 is a cross-sectional view taken along the line I-I' of the pixel of FIG. 5 according to an embodiment of the present invention.

The emission control drain electrode 177f may be connected to a pixel electrode 191 of an OLED 70 (see FIG. 6) through a contact hole 181 formed in a protective layer 180 (see FIG. 6).

FIG. 6 is a cross-sectional view taken along the line I-I' of the pixel of FIG. 5 according to an embodiment of the present invention.

Referring to FIGS. 5 and 6, a buffer layer 111 is disposed on a substrate 110. For example, the substrate 110 may be an insulating substrate formed of glass, quartz, ceramic, and plastic. The driving semiconductor layer 131a and the emission control semiconductor layer 131f are disposed on the buffer layer 111.

The driving semiconductor layer 131a includes the driving source region 176a and the driving drain region 177a that face each other with a driving channel region 131a1 (see FIG. 7) interposed. The emission control semiconductor layer 131f includes an emission control channel region 131f1, the emission control source region 176f, and an emission control drain region 133f.

A first gate insulating layer 141 formed of, for example, $SiN_x$ or $SiO_2$ may be disposed on the driving semiconductor layer 131a and the emission control semiconductor layer 131f. The first storage capacitor plate 125a and the emission control gate electrode 125f may be disposed on the first gate insulating layer 141. In addition, a second gate insulating layer 142 may cover the first storage capacitor plate 125a and the emission control gate electrode 125f. The second gate insulating layer 142 may be formed of $SiN_x$ or $SiO_2$.

The second storage capacitor plate 127 is disposed on the second gate insulating layer 142. The second storage capacitor plate 127 may overlap the first storage capacitor plate 125a to form the storage capacitor Cst.

The interlayer insulating layer 160 is disposed on the second gate insulating layer 142 and the second storage capacitor plate 127. The first gate insulating layer 141, the second gate insulating layer 142, and the interlayer insulating layer 160 may have a contact hole 163 that exposes the emission control drain region 133f of the emission control semiconductor layer 131f. The interlayer insulating layer 160 may be formed of a ceramic-based material such as $SiN_x$ and $SiO_2$.

The first auxiliary data line DLma, the second auxiliary data line DLmb, the first power source voltage line 172, the connection member 174, and the emission control drain electrode 177f are disposed on the interlayer insulating layer 160. The extension unit 127a of the second storage capacitor plate 127 may be disposed between the first auxiliary data line DLma and the second auxiliary data line DLmb and the second storage capacitor plate 127 includes the openings 41 (on both sides of the extension unit 127a) that overlap the first auxiliary data line DLma and the second auxiliary data line DLmb (e.g., in the thickness direction).

According to another embodiment, the organic light emitting display device may further include a data insulating layer disposed on the interlayer insulating layer 160. The first auxiliary data line DLma may be disposed on the interlayer insulating layer 160. The data insulating layer may be disposed on the first auxiliary data line DLma. The second auxiliary data line DLmb may be disposed on the data insulating layer. In another embodiment, the order of the first auxiliary data line DLma and the second auxiliary data line DLmb with respect to the data insulating layer may be reversed.

The emission control drain electrode 177f is connected to the emission control drain region 133f of the emission control semiconductor layer 131f through the contact hole 163 disposed in the interlayer insulating layer 160, the first gate insulating layer 141, and the second gate insulating layer 142. The first power source voltage line 172 is connected to the second storage capacitor plate 127 through the contact holes CH disposed in the interlayer insulating layer 160.

The protective layer 180 that covers the first auxiliary data line DLma, the second auxiliary data line DLmb, the first power source voltage line 172, and the emission control drain electrode 177f may be disposed on the interlayer insulating layer 160. The pixel electrode 191 may be disposed on the protective layer 180 and the pixel electrode 191 may be connected to the emission control drain electrode 177f through the contact hole 181 formed in the protective layer 180.

A barrier 350 may be formed at an edge of the pixel electrode 191 and on the protective layer 180 (e.g., to define the corresponding pixel). The barrier 350 includes a barrier opening 351 that exposes the pixel electrode 191. The barrier 350 may be formed of a resin or silica-based inorganic material such as polyacrylates resin and polyimides.

An organic light emitting layer 370 is disposed on the pixel electrode 191 exposed through the barrier opening 351, and a common electrode 270 is disposed on the organic light emitting layer 370. The OLED 70 includes the pixel electrode 191, the organic light emitting layer 370, and the common electrode 270.

Here, the pixel electrode 191 may be an anode (e.g., a hole injection electrode) and the common electrode 270 may be a cathode (e.g., an electron injection electrode). However, the present invention is not limited thereto. In another embodiment, the pixel electrode 191 may be the cathode and the common electrode 270 may be the anode.

Light is emitted when holes and electrons are respectively injected from the pixel electrode 191 and the common electrode 270 into the organic light emitting layer 370 and excitons (in which the injected holes and electrons are combined with each other) transition from an excited state to a base state.

The organic light emitting layer 370 may be formed of a low-molecular organic material or a polymer organic material such as poly 3,4-ethylenedioxythiophene (PEDOT). In addition, the organic light emitting layer 370 may be formed of a multi-layer including one or more among a light emitting layer, a hole injection layer (HIL), a hole transporting layer (HTL), an electron transporting layer (ETL), and an electron injection layer (EIL).

Figure 7:
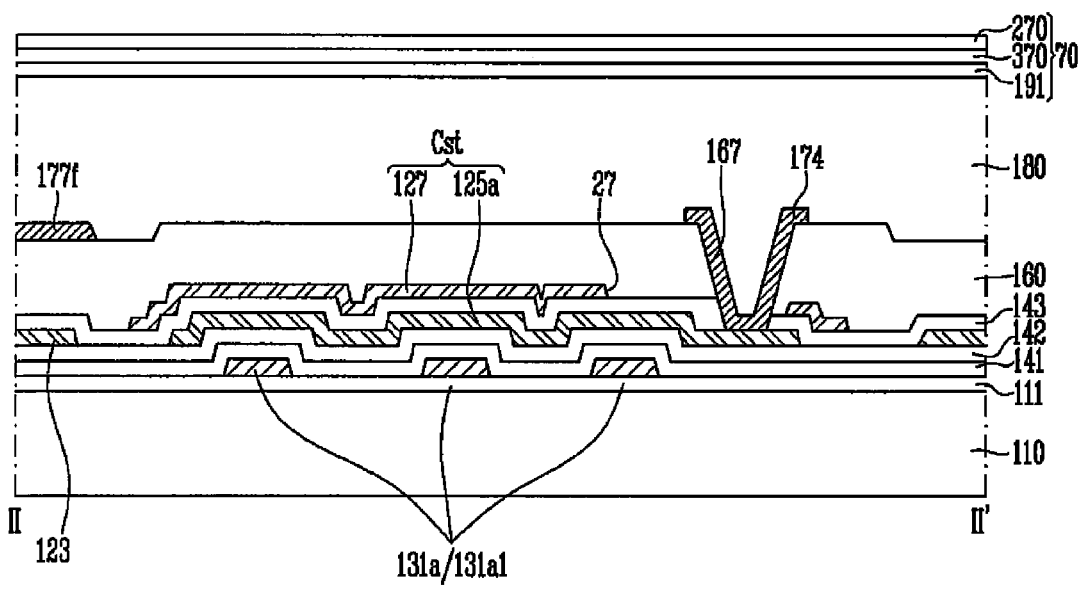
FIG. 7 is a cross-sectional view taken along the line of the pixel of FIG. 5 according to an embodiment of the present invention.

FIG. 7 is a cross-sectional view taken along the line ll-ll' of the pixel of FIG. 5 according to an embodiment of the present invention.

Referring to FIG. 5 and FIG. 7, the buffer layer 111 is formed on the substrate 110 and the driving semiconductor layer 131a (including the driving channel region 131a1) is formed on the buffer layer 111. The first gate insulating layer 141 and the second gate insulating layer 142 may be sequentially formed of, for example, $SiN_x$ or $SiO_2$ on the driving semiconductor layer 131a.

In addition, the emission control line 123 and the first storage capacitor plate 125a are formed on the second gate insulating layer 142 and a third gate insulating layer 143 is formed on the first storage capacitor plate 125a. The second storage capacitor plate 127 is formed on the third gate insulating layer 143 and forms the storage capacitor Cst with the first storage capacitor plate 125a.

The interlayer insulating layer 160 is formed on the second storage capacitor plate 127. The first storage capacitor plate 125a is connected to the connection member 174 through the contact hole 167 formed in the third gate insulating layer 143 and the interlayer insulating layer 160. In addition, the emission control drain electrode 177f is formed on the interlayer insulating layer 160. The protective layer 180 along with the pixel electrode 191, the organic light emitting layer 370, and the common electrode 270 (that make up the OLED 70) are sequentially formed on the second storage capacitor plate 127.

Figure 8:
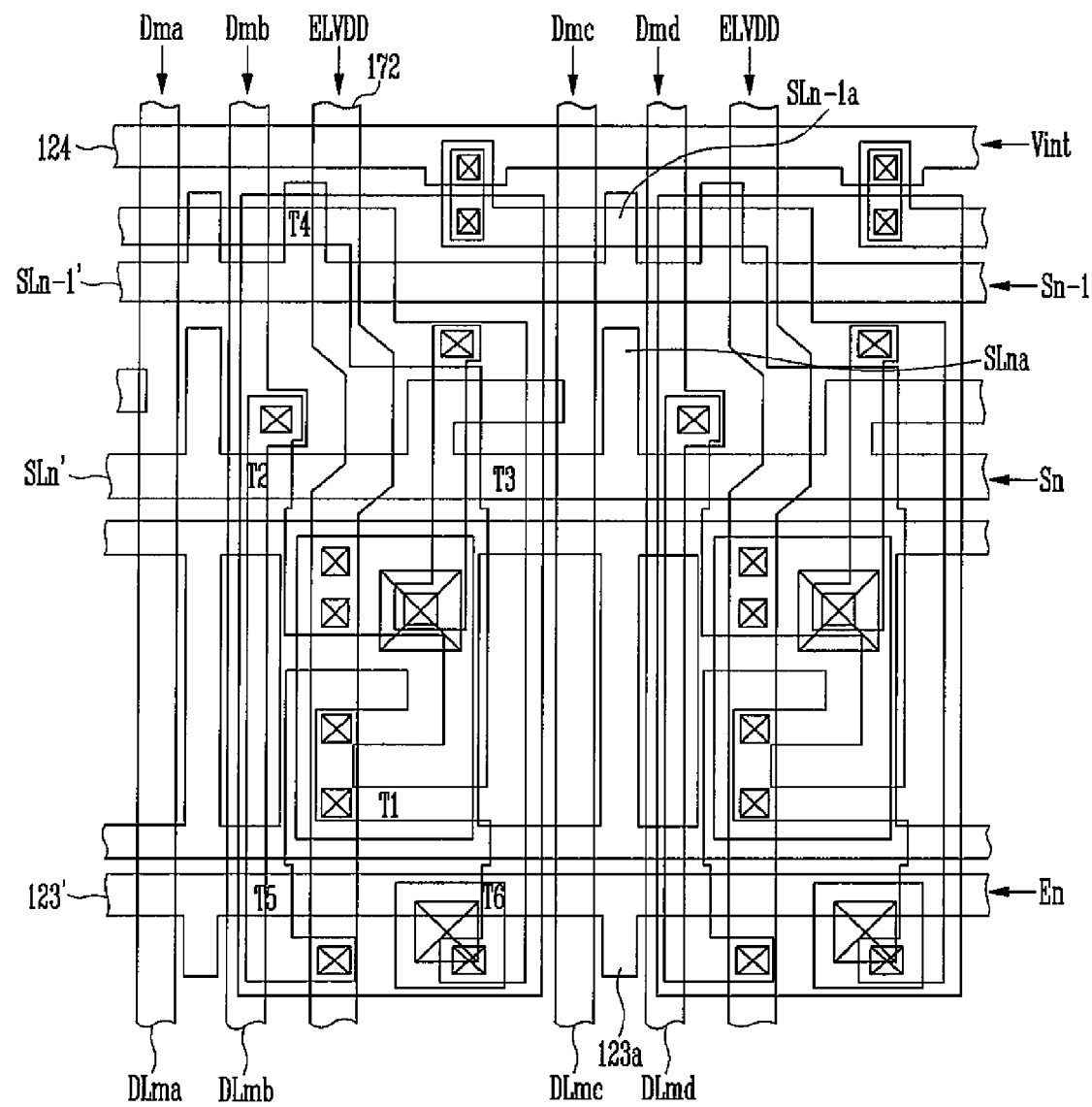
FIG. 8 is a schematic layout diagram of the display unit of FIG. 2 according to another embodiment of the present invention.

FIG. 8 is a schematic layout diagram of the display unit of FIG. 2 according to another embodiment of the present invention.

Since the display unit of FIG. 8 has substantially the same configuration as the display unit of FIG. 4 other than a scan line SLn', a previous scan line SLn-1', and an emission control line 123', repeated description may be omitted.

Referring to FIG. 8, the scan line SLn' may include a protrusion SLna that extends upward (as oriented in FIG. 8) between the third auxiliary data line DLmc and the fourth auxiliary data line DLmd in the first direction (the column direction) and a similar protrusion that extends upward between the first auxiliary data line DLma and the second auxiliary data line DLmb, and the previous scan line SLn-1' may include a protrusion SLn-1a that extends upward between the third auxiliary data line DLmc and the fourth auxiliary data line DLmd in the first direction (the column direction) and a similar protrusion that extends upward between the first auxiliary data line DLma and the second auxiliary data line DLmb.

In addition, the emission control line 123' may include a protrusion 123a that extends downward between the third auxiliary data line DLmc and the fourth auxiliary data line DLmd in the first direction (the column direction) and a similar protrusion that extends downward between the first auxiliary data line DLma and the second auxiliary data line DLmb. The protrusions SLna, SLn-1a, and 123a may be collinear with the extension units 127a of the second storage capacitor plates 127 (see FIG. 5).

Here, when the scan signal Sn is applied to protrusions SLna of the scan line SLn', it is possible to reduce or prevent coupling from being generated by the scan signal Sn applied at a constant voltage level between the third auxiliary data line DLmc and the fourth auxiliary data line DLmd that are adjacent to each other, and between the first auxiliary data line DLma and the second auxiliary data line DLmb that are adjacent to each other.

In addition, when the previous scan signal Sn-1 is applied to the protrusions SLn-1a of the previous scan line SLn-1', it is possible to reduce or prevent coupling from being generated by the previous scan signal Sn-1 applied at a constant voltage level between the third auxiliary data line DLmc and the fourth auxiliary data line DLmd that are adjacent to each other, and between the first auxiliary data line DLma and the second auxiliary data line DLmb that are adjacent to each other.

Further, when the emission control signal En is applied to the protrusions 123a of the emission control line 123', it is possible to reduce or prevent coupling from being generated by the emission control signal En applied at a constant voltage level between the third auxiliary data line DLmc and the fourth auxiliary data line DLmd that are adjacent to each other, and between the first auxiliary data line DLma and the second auxiliary data line DLmb that are adjacent to each other.

Example embodiments of the present invention have been disclosed herein, and although specific terms are employed, they are to be interpreted in a generic and descriptive sense only and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims, and their equivalents.

What is claimed is:

1. An organic light emitting display device comprising:
   a substrate, on which the organic light emitting display device further comprises:
      pixel columns extending in a column direction and adjacent to each other in a row direction;
      data lines extending in the column direction and adjacent to each other and between the pixel columns in the row direction;
      a power source line extending in the column direction;
      a scan line extending in the row direction;
      a switching transistor connected to the scan line and one of the data lines;
      a driving transistor connected to the switching transistor;
      an organic light emitting diode (OLED) connected to the driving transistor; and
      a storage capacitor connected between the driving transistor and the power source line, and comprising a first storage capacitor plate and a second storage capacitor plate overlapping the first storage capacitor plate in a thickness direction, connected to the power source line, and having a portion extending in the column direction between and not overlapping the data lines in the thickness direction.

2. The organic light emitting display device of claim 1, further comprising, on the substrate in the thickness direction, a first gate insulating layer between a semiconductor layer of the driving transistor and the first storage capacitor plate, and a second gate insulating layer between first storage capacitor plate and the second storage capacitor plate.

3. The organic light emitting display device of claim 2, wherein the first storage capacitor plate overlaps the semiconductor layer of the driving transistor in the thickness direction.

4. The organic light emitting display device of claim 1, wherein the second storage capacitor plate is connected to the power source line through a contact hole.

5. The organic light emitting display device of claim 1, further comprising, on the substrate in the thickness direction, an interlayer insulating layer between the second storage capacitor plate and the data lines.

6. The organic light emitting display device of claim 5, wherein the data lines constitute a same layer.

7. The organic light emitting display device of claim 5, further comprising, on the substrate in the thickness direction, a data insulating layer between the interlayer insulating layer and one of the data lines, wherein another one of the data lines is between the interlayer insulating layer and the data insulating layer.

8. The organic light emitting display device of claim 5, wherein the power source line constitutes a same layer as the data lines on the interlayer insulating layer.

9. The organic light emitting display device of claim 1, wherein the scan line comprises a protrusion extending in the column direction between and not overlapping the data lines in the thickness direction.

10. The organic light emitting display device of claim 1, wherein the scan line constitutes a same layer as the second storage capacitor plate.

11. The organic light emitting display device of claim 1, further comprising, on the substrate: a previous scan line extending in the row direction; and an initializing transistor that is between the driving transistor and an initializing voltage line extending in the row direction, and that is connected to the previous scan line, wherein the previous scan line comprises a protrusion extending in the column direction between and not overlapping the data lines in the thickness direction.

12. An organic light emitting display device comprising:
a substrate, on which the organic light emitting display device further comprises:
  pixel columns extending in a column direction and adjacent to each other in a row direction;
  data lines extending in the column direction and adjacent to each other and between the pixel columns in the row direction;
  a power source line extending in the column direction;
  a scan line extending in the row direction;
  a switching transistor connected to the scan line and one of the data lines;
  a driving transistor connected to the switching transistor;
  an organic light emitting diode (OLED) connected to the driving transistor; and
  a storage capacitor comprising a first storage capacitor plate and a second storage capacitor plate overlapping the first storage capacitor plate in a thickness direction, connected to the power source line, having a portion extending in the column direction between and not overlapping the data lines in the thickness direction, and having openings exposing the data lines in the thickness direction.

13. An organic light emitting display device comprising:
a substrate, on which the organic light emitting display device further comprises:
  pixel columns extending in a column direction and adjacent to each other in a row direction;
  data lines extending in the column direction and adjacent to each other and between the pixel columns in the row direction;
  a power source line extending in the column direction;
  a scan line extending in the row direction;
  a switching transistor connected to the scan line and one of the data lines;
  a driving transistor connected to the switching transistor;
  an organic light emitting diode (OLED) connected to the driving transistor;
  a storage capacitor comprising a first storage capacitor plate and a second storage capacitor plate overlapping the first storage capacitor plate in a thickness direction, connected to the power source line, and having a portion extending in the column direction between and not overlapping the data lines in the thickness direction; and
  an emission control line extending in the row direction and an emission control transistor between the driving transistor and the OLED and connected to the emission control line, wherein the emission control line comprises a protrusion extending in the column direction between and not overlapping the data lines in the thickness direction.

* * * * *